United States Patent
Beitelmal et al.

(10) Patent No.: US 7,361,081 B2
(45) Date of Patent: Apr. 22, 2008

(54) SMALL FORM FACTOR AIR JET COOLING SYSTEM

(75) Inventors: Abdlmonem H. Beitelmal, Los Altos, CA (US); Chandrakant D. Patel, Fremont, CA (US); Cullen E. Bash, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/898,736

(22) Filed: Jul. 23, 2004

(65) Prior Publication Data

US 2006/0019597 A1 Jan. 26, 2006

(51) Int. Cl.
H05K 5/02 (2006.01)

(52) U.S. Cl. ...................................... 454/184; 361/691

(58) Field of Classification Search ................ 454/184; 361/691–695, 687, 685; 165/80.3
See application file for complete search history.

(56) References Cited

U.S. PATENT DOCUMENTS

| | | | |
|---|---|---|---|
| 4,158,875 A | 6/1979 | Tajima et al. | |
| 4,489,363 A | 12/1984 | Goldberg | |
| 4,756,473 A | 7/1988 | Takemai et al. | |
| 4,817,865 A | 4/1989 | Wray | |
| 5,019,880 A | 5/1991 | Higgins et al. | |
| 5,216,579 A | 6/1993 | Basara et al. | |
| 5,219,579 A | 6/1993 | Tisdale et al. | |
| 5,361,188 A | 11/1994 | Kondou et al. | |
| 5,409,352 A | 4/1995 | Lin | |
| 5,414,591 A | 5/1995 | Kimura et al. | |
| 5,505,533 A | 4/1996 | Kammersqard et al. | |
| 5,559,673 A * | 9/1996 | Gagnon et al. | 361/695 |
| 5,640,046 A | 6/1997 | Suzuki et al. | |
| 5,661,638 A | 8/1997 | Mira | |
| 6,021,042 A * | 2/2000 | Anderson et al. | 361/695 |
| 6,052,282 A | 4/2000 | Sugiyama et al. | |
| 6,105,875 A | 8/2000 | LaGrotta et al. | |
| 6,134,108 A | 10/2000 | Patel et al. | |
| 6,196,003 B1 * | 3/2001 | Macias et al. | 62/3.7 |
| 6,222,729 B1 | 4/2001 | Yoshikawa | |
| 6,280,318 B1 * | 8/2001 | Criss-Puszkiewicz et al. | 454/184 |

(Continued)

FOREIGN PATENT DOCUMENTS

DE 004035213 A1 5/1992

(Continued)

OTHER PUBLICATIONS

Abdlmonem H. Beitelmal et al., "The Effect of Inclination on the Heat Transfer Between a Flat Surface and an Impinging Two-Dimensional Air Jet," Int'l J. of Heat and Fluid Flow 21, 156-163 (2000).

(Continued)

Primary Examiner—Gregory Wilson

(57) ABSTRACT

An enclosure forms a plurality of tiers vertically stacked in a longitudinal dimension. Each tier is a 1U modular computer system having a computer chassis configured for mounting in the multi-tiered support, and computer components that need cooling within the computer chassis. A cooling system is formed by a plenum pressurized by a blower. The plenum defines a plurality of configurable orifices in the chassis, each directing pressurized air toward a component. The plenum includes adjustable valves to controllably limit airflow through the orifices, and a controller to control the air pressure within the plenum and the orifice flow rates through the valves.

16 Claims, 3 Drawing Sheets

U.S. PATENT DOCUMENTS

| | | |
|---|---|---|
| 6,305,556 B1 | 10/2001 | Mayer |
| 6,415,619 B1 | 7/2002 | Bash et al. |
| 6,424,534 B1 | 7/2002 | Mayer et al. |
| 6,490,877 B2 | 12/2002 | Bash et al. |
| 6,496,366 B1 | 12/2002 | Coglitore et al. |
| 6,525,936 B2 * | 2/2003 | Beitelmal et al. ........... 361/695 |
| 6,535,382 B2 | 3/2003 | Bishop et al. |
| 6,574,104 B2 | 6/2003 | Patel et al. |
| 6,574,970 B2 | 6/2003 | Spinazzola et al. |
| 6,611,428 B1 | 8/2003 | Wong |
| 6,616,251 B2 | 9/2003 | Searby |
| 6,621,693 B1 * | 9/2003 | Potter et al. ................. 361/685 |
| 6,626,300 B2 | 9/2003 | Kaminski et al. |
| 6,628,520 B2 * | 9/2003 | Patel et al. .................. 361/696 |
| 6,644,058 B2 | 11/2003 | Bash et al. |
| 6,652,374 B2 | 11/2003 | Sharp et al. |
| 6,662,865 B2 | 12/2003 | Beitelmal et al. |
| 6,665,180 B2 * | 12/2003 | Lehman et al. .............. 361/688 |
| 6,672,381 B2 | 1/2004 | Beitelmal et al. |
| 6,678,156 B2 | 1/2004 | Moizer |
| 6,694,759 B1 | 2/2004 | Bash et al. |
| 6,775,137 B2 | 8/2004 | Chu et al. |
| 6,819,563 B1 * | 11/2004 | Chu et al. ................... 361/696 |
| 6,822,859 B2 * | 11/2004 | Coglitore et al. ........... 361/687 |
| 6,912,129 B2 | 6/2005 | Baker et al. |
| 6,972,954 B2 * | 12/2005 | Minamitani et al. ........ 361/687 |
| 6,982,872 B2 * | 1/2006 | Behl et al. ................... 361/687 |
| 6,988,537 B2 * | 1/2006 | Hata et al. ............. 165/104.33 |
| 2003/0198018 A1 * | 10/2003 | Cipolla et al. .............. 361/687 |

FOREIGN PATENT DOCUMENTS

| | | |
|---|---|---|
| JP | 405235570 A | 9/1993 |

OTHER PUBLICATIONS

Abdlmonem H. Beitelmal & Chandrakant D. Patel,, "Effects of Surface Roughness on the Average Heat Transfer of an Impinging Air Jet," Int. Comm. Heat Mass Transfer, vol. 27, No. 1, 1-12 (2000).

U.S. Appl. No. 10/735,467, filed Dec. 12, 2003, by Chandrakant D. Patel, entitled "Longitudinally Cooled Electronic Assembly".

Beitelmal, Saad and Patel, "Effects of Surface Roughness on the Average Heat Transfer of an Impinging Air Jet" (Int. Comm. Heat Mass Transfer, vol. 27, No. 1, pp. 1-12, 2000).

Beitelmal, Saad and Patel, "The effect of inclination on the heat transfer between a flat surface and an impinging two-dimensional air jet" (Int'l J. Heat and Fluid Flow 21 (2000) 156-163).

* cited by examiner

SMALL FORM FACTOR AIR JET COOLING SYSTEM

The present invention relates generally to multi-tiered, modular rack systems for components and, more particularly, to a cooling system for cooling components in a small form factor chassis mounted in a standardized system rack.

BACKGROUND OF THE INVENTION

Multi-tiered, modular racks are commonly used with groups of modular chassis. Such racks commonly provide each chassis access to network connections and electrical power. A typical chassis might contain components and interconnecting devices (e.g., printed circuit board cards and wires) that form a computer system such as a server. Each chassis functions to provide an environment relatively free from excessive heat, shock, vibration and/or dust for the computer system. Groups of these computer systems are interconnected to form electronic applications, such as server farms that serve the networking needs of business organizations.

In present-day, standardized racks, 1U "pizza-box" chassis (being 1.75 inches tall, and various lateral sizes such as 19 by 24 inches), each housing a separate computer having one or more CPUs, are found useful. In particular, the small form factor (i.e., size) allows for a large number of computers to be vertically stacked, typically with up to around 40U or 42U, or even as many as 47 U in each rack. The modular nature of each such chassis allows for a given computer system to be swapped out of the network and the rack without interfering with the operation of other computer systems.

Each chassis typically has one or more air movers (e.g., fans) that pump cool air through the chassis to absorb heat from the components, or from heat sinks attached to the components. In response to demands for networks of high-performance computer systems, components are being designed with increased cooling requirements, and printed circuit boards are being designed with increased component densities. Managing these increased heat-dissipation requirements is complicated by the limited size of the 1U chassis. In particular, the small form factor limits both the available fan sizes and the space for air to flow through the chassis. The limited space typically includes many impediments, such as heat sinks, wires and components, causing significant airflow impedance. As a result, the airflow through the chassis can be significantly limited, thereby limiting the dissipation ability of the chassis cooling system. Furthermore, the tight space configuration can create cooling issues such as hot spots, dead zones and/or insufficient cooling capacity in particular chassis locations.

It will therefore be appreciated that a need exists for a cooling system and apparatus for effectively cooling the heat-dissipating components housed within a 1U chassis in multi-tiered, modular racks. A need also exists for a resulting modular rack system. Preferred embodiments of the present invention satisfy some or all of these needs, and provide further related advantages.

SUMMARY OF THE INVENTION

In various embodiments, the present invention may solve some or all of the needs identified above, providing a rack-mounted thin chassis having a cooling system configured to cool components. More particularly, the invention provides a modular processing system for mounting in a multi-tiered support. The processing system includes a chassis configured for mounting in the multi-tiered support, and one or more components within the chassis.

The invention features a cooling system including a plenum and a blower, the blower being configured to pressurize the plenum. The plenum defines a plurality of orifices in the chassis, each orifice being configured to direct pressurized air from the plenum to flow toward a respective component of the plurality of components. The airflow directed at the respective components provides cooling to the components, which might include a heat sink to add cooling efficiency.

The plenum may define passageways forming the plurality of orifices, and the passageways may be adjustable such that they can direct pressurized air toward components at different locations within the chassis. The plenum may include adjustable valves configured to controllably limit airflow from the plenum through the various orifices to one or more nonzero flow levels, and possibly to a closed state (i.e., a zero-flow flow level). As such, the plenum might be adjustable to different component layouts and different cooling requirements.

The invention may further feature a controller configured to control the heat dissipation provided by the cooling system during its operation. It may operate based on the changing cooling needs of the components toward which the orifices direct airflow. The controller may be configured to control the air pressure within the plenum, such as by controlling the power level at which the blower operates, and to controllably limit airflow from the plurality of orifices.

Other features and advantages of the invention will become apparent from the following detailed description of the preferred embodiments, taken with the accompanying drawings, which illustrate, by way of example, the principles of the invention. The detailed description of particular preferred embodiments, as set out below to enable one to build and use an embodiment of the invention, are not intended to limit the enumerated claims, but rather, they are intended to serve as particular examples of the claimed invention.

DETAILED DESCRIPTION OF THE PREFERRED EMBODIMENTS

The invention summarized above and defined by the enumerated claims may be better understood by referring to the following detailed description, which should be read with the accompanying drawings. This detailed description of particular preferred embodiments of the invention, set out below to enable one to build and use particular implementations of the invention, is not intended to limit the enumerated claims, but rather, it is intended to provide particular examples of them.

Typical embodiments of the present invention reside in a computer processing system including a tiered apparatus for supporting, cooling, and connecting or interconnecting a plurality of thin, stackable computer chassis. The tiered apparatus is typically in the form of a multi-tiered modular support rack, which can optionally be configured with wiring such that the computer chassis receive power, and interconnect to form networked computer systems or other electronic devices. One or more of the chassis, along with the tiered apparatus, preferably form a modular computer system.

Figure 1:
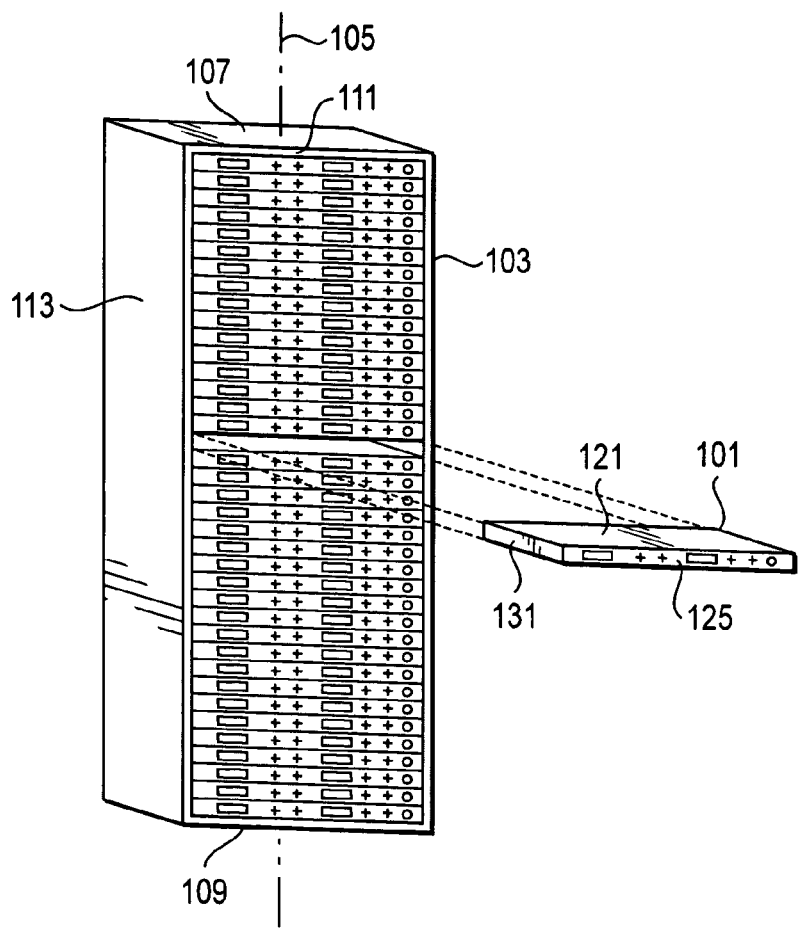
FIG. 1 is a perspective view of a multi-tiered modular rack, with a removed modular chassis, embodying the invention.

With reference to FIG. 1, a first embodiment of the present invention is an apparatus forming a tiered structure. More particularly, the embodiment includes a multi-tiered support configured to hold a plurality of computer chassis 101. Preferably the multi-tiered support is a conventional modular rack 103 configured for a plurality of 1U servers.

The chassis 101 are stacked in a tier-stacking dimension, which will be referred to as a longitudinal dimension 105. The longitudinal dimension extends between two ends of the stack, a top end 107 and a bottom end 109. Besides the top and bottom ends, the tiered structure includes four lateral sides: a front side 111 and opposite rear side, and a left side 113 and opposite right side.

Figure 2:
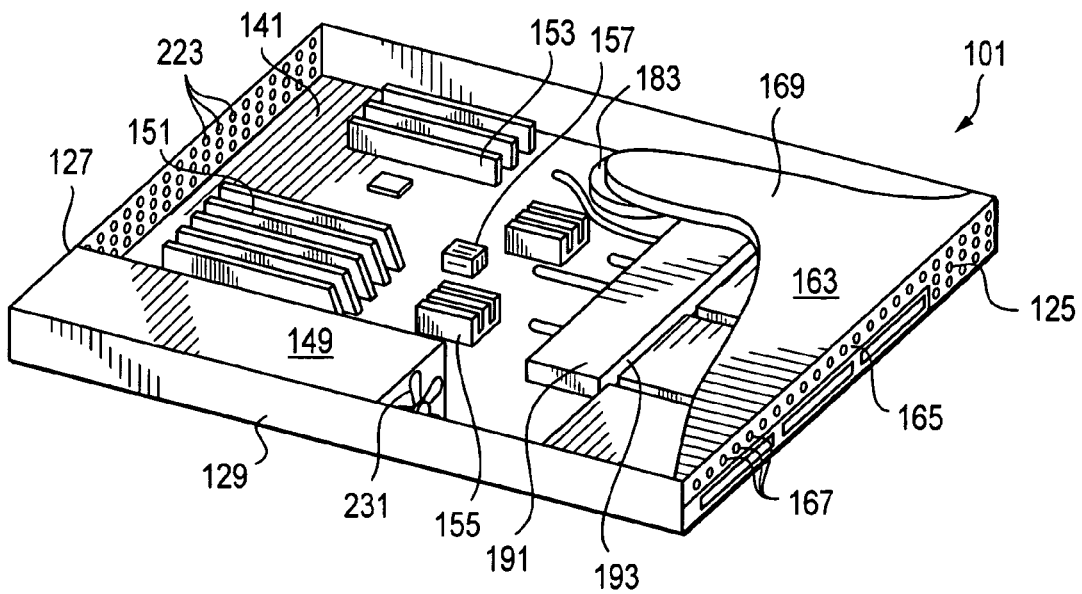
FIG. 2 is an enlarged, perspective view of the removed chassis depicted in FIG. 1.
Figure 3:
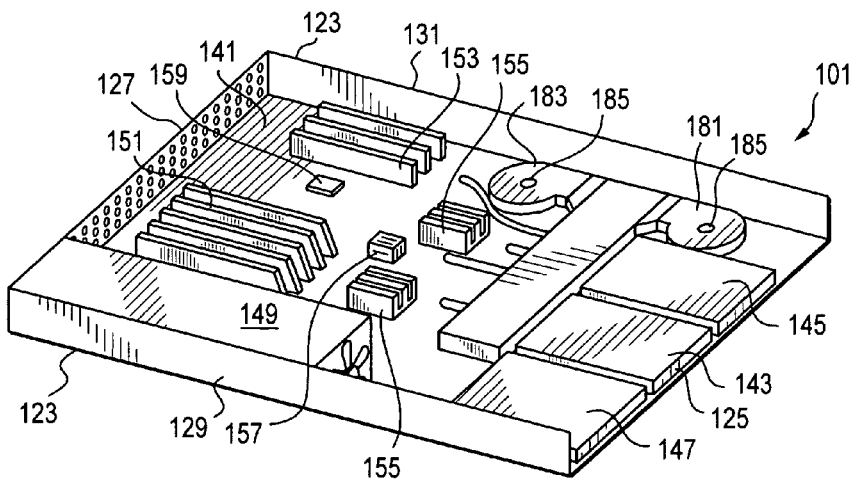
FIG. 3 is a second perspective view of the chassis depicted in FIG. 2, with a manifold, which is a portion of a cooling system, removed to reveal underlying features.
Figure 4:
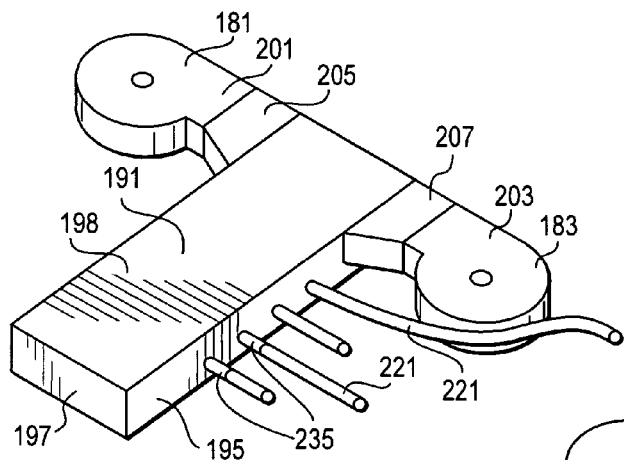
FIG. 4 is an enlarged, reverse perspective view of the portion of the cooling system depicted in FIG. 3.

With reference to FIGS. 1 to 3, similar to the modular rack 103, each chassis 101 has opposite longitudinal ends, a top end 121 and a bottom end 123, along (and with respect to) the longitudinal dimension 105. Each chassis also has a front side 125, a rear side 127, a left side 129 and a right side 131, each chassis side and end corresponding to the similarly named sides and ends of the modular rack when the chassis is mounted in the rack. In the discussion below, the terms front, rear, right and left, when used in other contexts, will conform to the respective directions for the chassis. Preferably each chassis is a thin chassis (i.e., thin along the longitudinal dimension 105), typically being a 1U rack-mount chassis (i.e., being 1U in height and configured to fit in a standard rack), or alternatively ranging in size up to 2U in height.

Each chassis 101 is configured with a printed circuit board ("PCB") bottom panel 141 to support and/or interconnect one or more electronic assemblies, which may include a floppy drive 143, a CD and/or DVD drive 145, a hard disk drive 147, a power supply 149, memory cards 151, input/output ("I/O") units 153, a plurality of central processor units ("CPUs") having high heat-dissipation requirements, each CPU preferably having a CPU heat sink 155 mounted on top, other high-dissipation components, each other high-dissipation component preferably having a other high-dissipation component heat sink 157 mounted on top, and some moderate heat-dissipation components 159 (i.e., having moderate heat-dissipation requirements), which might or might not be fitted with heat sinks. The power supply adjoins the left and rear sides of the chassis 101. The bottom panel is preferably a printed circuit board wired to interconnect the electronic assemblies to form a computer configured for use as a network server, an application-specific thin server, or the like.

The chassis and modular rack are configured to provide an environment relatively free from excessive shock, vibration and/or dust. In particular, the chassis bottom panel 141, front side 125, rear side 127, left side 129 and right side 131 form five sides of a controlled chassis chamber containing the electronic assemblies. The sixth side may be formed by an additional chassis panel, a panel in the modular rack, or by a bottom panel of a neighboring chassis contiguous with the top end 121 of the chassis 101.

The chassis and its electronic assemblies are also configured with a convective cooling system to dissipate heat from the electronic assemblies requiring heat dissipation. More particularly, the chassis includes an intake manifold 163 (not depicted in FIG. 3 to show underlying components) that has a front panel 165 preferably extending across a substantial portion the chassis front side 125. The intake manifold front panel 165 defines intake air vents 167 that preferably place the exterior of the chassis (and preferably the exterior of the modular computer system) in fluid communication with a manifold internal chamber defined within walls 169 of the intake manifold.

The intake manifold 163 is further configured with ports (not depicted) configured to place the manifold internal chamber in fluid communication with two blowers, a front blower 181 and a rear blower 183. The blowers are preferably low-profile, centrifugal blowers, each with a centrifugal impeller axis of rotation extending in the longitudinal dimension 105. The intake manifold extends longitudinally above the blowers, and the intake manifold ports provide intake air longitudinally into a blower intake 185 in the center of the centrifugal impeller of each blower. The intake manifold thus places the intake of each blower in fluid communication with external air from the front of the chassis. Variations of this embodiment could have the intake manifold configured differently, such as extending under the blowers rather than over them.

With reference to FIGS. 2 to 6, the blowers 181 and 183 are positioned on opposite sides of a rectangular plenum 191. With reference to the front, rear, left and right lateral sides of the chassis, the plenum optionally has a longer lateral dimension extending partially across the chassis from right to left, and a shorter lateral dimension extending through the chassis from front to rear. The front blower 181 is positioned in front of a right side of a front lateral wall 193 of the plenum. The rear blower 183 is positioned to the rear of a right side of a rear lateral wall 195 of the plenum. The plenum also includes a right lateral wall 196, a left lateral wall 197, a top wall 198 and a bottom wall 199. The blower centrifugal impellers are preferably configured to rotate in opposite directions from each other.

The front and rear blowers are configured with respective first and second exhaust ports 201, 203, that direct air impelled by the respective centrifugal impellers into respective first and second diffusers 205 and 207. The diffusers are preferably configured with a chamber expanding in a downstream flow direction to slow the air without adding significant flow resistance. In each case, downstream is defined as toward the plenum. The blowers, diffusers and plenum are also part of the cooling system.

Figure 5:
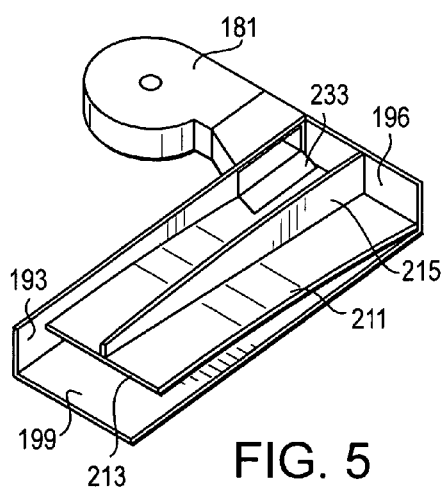
FIG. 5 is a perspective, cutaway view of the cooling system portion depicted in FIG. 4, with a blower, a diffuser, and four outlet tubes removed, and with rear, right and top walls cut away, to reveal underlying features.
Figure 6:
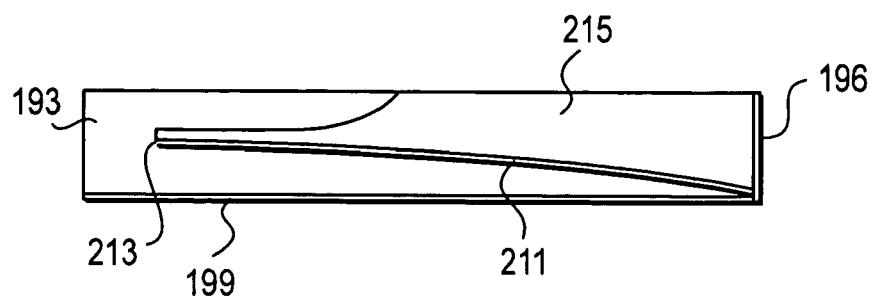
FIG. 6 is a rear view of the cutaway cooling system portion depicted in FIG. 5.

As depicted in FIGS. 5 and 6, which are depicted without showing the rear wall 195, the left lateral wall 197 and the top wall 198 of the plenum 191 to depict the plenum inner structure, the plenum includes an inner baffle 211 that divides an interior chamber of the plenum into a top chamber and a bottom chamber. The baffle abuts the right lateral wall 196, the front wall 193 and the rear wall 195 of the plenum, but does not extend to the left lateral wall 197. This configuration provides the upper and lower chambers to be in fluid communication around a left end 213 of the baffle.

A divider 215 symmetrically subdivides the upper chamber into a front portion and a rear portion. The divider preferably adjoins the right lateral wall 196 (preventing immediate and direct intermixing of the air from the blowers) and the baffle, extending toward the left, to the left end 213 of the baffle. The divider extends up to the top wall 198 along a portion near the right wall (further preventing immediate and direct intermixing of the air from the blowers), but separates from the top wall to the left of that portion to allow fluid communication between the front and rear portions of the upper chamber.

With reference again to FIGS. 2 to 6, the first and second diffusers 205 and 207 feed the air from the front and rear blowers 181 and 183 into the plenum 191. The air is directed into the plenum upper chamber through opposing openings in the front and rear walls. This air, which is initially directed toward the divider, is prevented from directly and immediately intermixing, and turns and passes through the upper chamber toward the left wall. As the air flows to the left, it passes into the portion of the top chamber where the divider does not extend to the top wall, and the air in the front and rear portions of the upper chamber begin to intermix.

Upon passing the left end 213 of the baffle 211, the air flows down into the bottom chamber and turns back toward the right lateral wall 196. Because of the baffle and divider, the two blowers maintain the lower chamber at a substantially uniform static pressure that is above the ambient atmospheric pressure (i.e., it is pressurized), and that pressure does not substantially fluctuate due to blower turbulence.

The plenum includes at least one, and typically a plurality of outlet tubes 221 forming passageways therewithin, the passageways being in fluid communication with the plenum bottom chamber. Each outlet tube forms an orifice configured to direct pressurized air from the plenum bottom chamber such that the air blown into the bottom chamber is directed to flow out the orifice at items needing to be cooled (e.g., computer components). The orifices direct the airflow toward their respective components, i.e., at different components rather than a single component. Redundant groups of orifices, which direct airflow at a single component, may also be used. The substantially uniform static pressure in the bottom chamber provides for pressurized airflow out each orifice at a rate that is substantially constant. The constant airflow from each orifice provides a steady level of cooling for the item at which the orifice is directed.

The outlet tubes are preferably targeted to direct the plenum air toward the cards 153 and various heat sinks 155 and 157 that would most benefit from additional heat dissipation. Typically, though not necessarily, the outlet tubes direct plenum air in a rearward direction, toward the rear side 127 of the chassis 101. The chassis vents air through exhaust air vents 223 defined in the rear side of the chassis.

The floppy drive 143, CD and/or DVD drive 145, hard disk drive 147, and power supply 149 may include dedicated cooling fans 231 to enhance cooling of these devices. In some cases, these cooling fans might draw additional air into the chassis through their respective devices.

As a result of the above-described configuration, each high-dissipation component, including each CPU, may be conductively cooled by a heat sink, which is convectively cooled by an air jet. Additionally, other components having significant cooling requirements, such as certain cards, may be convectively cooled directly by an air jet. Other components in the chassis are convectively cooled by air flowing through the chassis to the rear, the air coming from either the outlet tubes or the fans 231. Advantageously, the modular rack 103 can also house chassis employing other types of cooling systems.

Typically, each active outlet tube (i.e., open outlet tube from which air is flowing at a substantially nonzero flow level) will lower the static pressure within the plenum. For efficient operation, limiting the flow rates through each orifice to an appropriate level for the cooling needs of the orifice's associated item to be cooled (e.g., a hot component) is desirable, thereby minimizing the increased power necessary to maintain the static pressure in light of the open orifice.

The components requiring cooling are likely to be located at various distances from the plenum, which may cause different levels of flow impedance in the various outlet tubes. This difference may be compensated for by varying the flow resistance in the passageway (e.g., by varying the cross sectional size or shape) within the outlet tube. Furthermore, because some components might require different levels of airflow for adequate cooling, the outlet tube's passageway can be further sized to provide cooling airflow at a desired level for each cooled component. The necessary blower power and passageway size can be established experimentally, or may be formulated by those skilled in the art.

Optionally, the plenum may include one or more adjustable valves 235, each being configured to controllably limit the airflow from the plenum through one orifice. More particularly, the airflow is limited to occur at one, two or more (and possibly a continuous spectrum of) substantially nonzero flow levels, and might also include a substantially zero-flow (closed) flow level that substantially prevents airflow from the orifice. Using such a valve, the orifice can be adjusted to provide airflow at a desired flow rate appropriate for the cooling needs (or lack thereof) of the respective component. Adjustable valves that operate to control the flow through more than one orifice are also within the scope of the invention.

The plenum can be reconfigured to cool other components by replacing or reconfiguring the outlet tubes to adjust the passageway such that pressurized air can be directed toward other locations within the chassis. The reconfiguration might be accomplished by using flexible outlet tubes, or with easily replaced (interchangeable) outlet tubes. Also, some or all of the outlet tubes may be configured with valves that provide for some outlet tubes to be closed, substantially preventing airflow from their respective orifices. These features allow for a generic plenum to be configured for, and used in, a variety of chassis having different configurations of hot components. For any given chassis, such a plenum need only be configured with the appropriate outlet tube configuration, and any extra outlet tubes can be shut off (i.e., closed) for efficient operation.

Optionally, the chassis 101 includes a controller to control the operation of the cooling system, and/or the combined operation of the cooling system and the hot components so as to manage heat dissipation from the components. The controller can be within the chassis, or it can be shared among numerous chassis. The controller is preferably configured to control the airflow rate out of the orifices, and is preferably configured to control the flow rate out of each orifice.

To control the orifice flow rates, the controller may be configured to control the operation of the blowers 181 and 183, and may further be configured to control the operation of each blower separately, such as by controlling the power level at which each blower operates. The blowers are preferably either totally or partially redundant, allowing for the cooling system to maintain either a full or an operationally significant level of cooling upon the partial or total failure of one blower. By controlling the blowers, the controller can control (and if need be adjust) the static pressure in the lower chamber of the plenum, and can compensate for failures of, or differences between, the blowers.

Further control can be had over the static pressure in the lower chamber by optionally configuring the inner baffle 211 to be hingedly attached (such as by a hinge) to the right lateral wall 196, with an actuator controlling the rotation of the inner baffle on the hinge. Under the control of the controller, the actuator can adjust the distance between the left end 213 of the baffle and the bottom wall 199.

The plenum 191 may also be configured with one or more closures, such as in the form of flaps 233 that can be actuated to close off the first or second diffusers 205 and 207, and thereby prevent blower backflow through the cooling system blowers. If they are located at the junction (i.e., openings) between the diffusors and the plenum (as depicted), then they can be on any side (e.g., top, bottom, right, left) of the junction. They can also be in the blower, the diffusor, or even within the plenum. The flaps may be actuated by a number of different means, such as gravity, actuators, springs, air pressure, or a combination thereof. For example, flaps on a top edge of the junction could close under the force of gravity, and open due to the air pressure generated by their respective blower. These control features may prove particularly useful for controlling the pressure in the lower chamber if one of the blowers 181 and 183 malfunctions. In such a case, the backpressure generated by the other blower can actuate the flap shut and/or press it firmly in place to create a seal.

Additionally, to control the orifice flow rates, the controller may be configured to control the operation of outlet-tube valves. More particularly, the control system is preferably configured to configure the operation of the cooling system for a given PC board layout, and is further configured to operate the valves so as to actively control the valves to regulate the cooling provided by each outlet tube according to the cooling requirements of the component or components (e.g., the high dissipation components) cooled by that outlet tube. Such cooling requirements can be monitored by using temperature sensors, or by monitoring computer system operations to determine the activity level of the component(s).

Adjusting an outlet-tube valve will typically change the static pressure in the plenum lower chamber, barring any compensating change in the operation of the blowers or in other outlet-tube valves. Given an adjustment in one or more outlet-tube valves, the controller preferably adjusts the operation of the blowers to compensate for any pressure change that would be caused by the adjustment. The controller may monitor pressure changes directly (e.g., with a pressure sensor), or indirectly, such as by monitoring the flow rates or cooling effects of the outlet tubes (such as by sensing the temperature of a processor, processor lid, other component or heat sink), or might operate using a previously established formula or lookup table based upon blower power levels and valve settings.

The controller could also be configured to limit the operation of the components such that their heat dissipation requirements do not exceed the available cooling capacity of the cooling system. The cooling capacity can be affected by many variables, such as the available power level, the operating condition of the blowers, the operating condition of the valves, the temperature of the air in the plenum, and the like.

The controller may comprise separate hardware and software infrastructure, which could be directly mounted on other cooling components. Such a system could also be mounted on the PCB bottom panel 141, or on a card attached thereto. Alternatively, the controller could be software based and incorporated into the hardware system carried in the chassis. In yet other alternatives, the controller could be external to the chassis, and a single controller could be configured to control the operation of the cooling systems of a plurality of chassis, such as all the chassis in the modular rack 103.

A variation of this embodiment is similar to the first embodiment in many features. This variation differs in that rather than (or supplemental to) drawing in ambient air to cool components, a source of preferably chilled air or another gaseous fluid is in fluid communication with the chassis, preferably via passageways within the rack. The chilled fluid is fed to the blowers, either individually or through a manifold.

While the depicted enclosure of the first embodiment appeared as a unitary rack with laterally inserted chassis, it is to be understood that other configurations, such as modular structures that can be modularly disassembled, are within the scope of the invention. For example, each chassis could be configured as a stackable module with connectors that provide electrical and electronic connections for other chassis in the stack, allowing for a structure of configurable longitudinal height.

Figure 7:
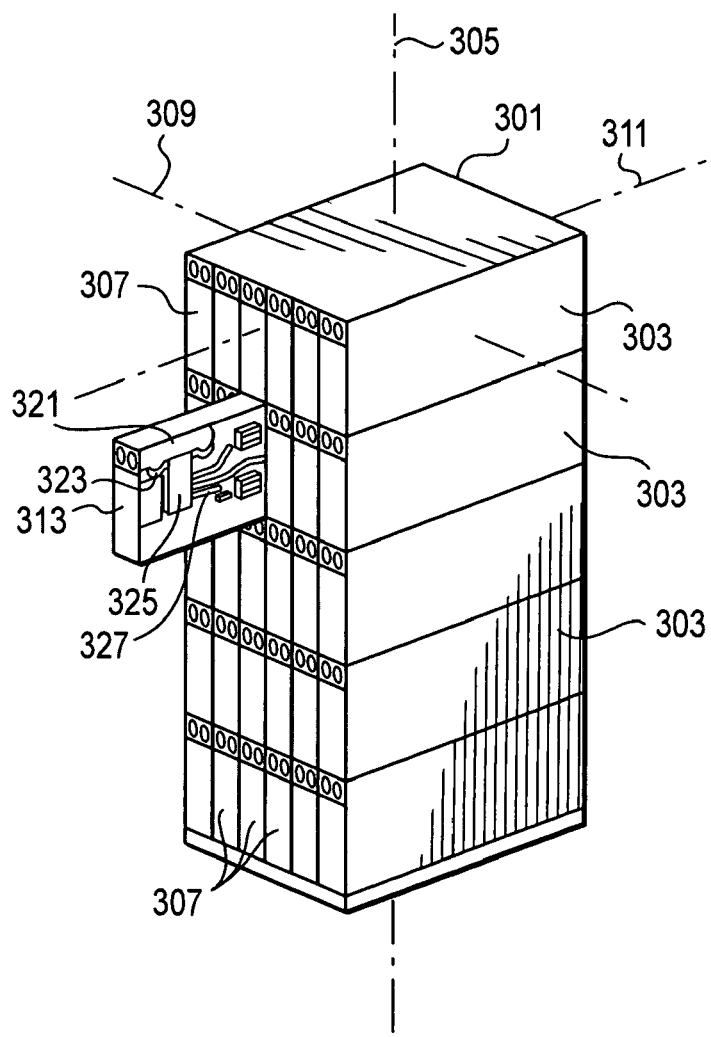
FIG. 7 is a perspective view of a multi-layered, multi-tiered modular rack, with a partially removed modular chassis, embodying the invention.

With reference to FIG. 7, another embodiment within the scope of the invention is a rack 301 having a plurality of vertical layers 303 along a vertical dimension 305, each vertical layer having a plurality of laterally stacked chassis 307 forming a series of lateral tiers in a first lateral tier-stacking dimension 309. Each chassis is insertable along a second, lateral, insertion dimension 311. Each chassis is thin along the tier-stacking dimension, and is typically sized at 1U.

As seen in a representative chassis 313 (of the plurality of chassis 307), which is partially removed along the insertion dimension from the rack in FIG. 7, each chassis 307 has a configuration similar to those described in the prior embodiment. More particularly, they include an intake manifold 321, front and rear blowers 323, and a plenum 325 having one or more outlet tubes 327. The orientation of these components with respect to the lateral tier-stacking dimension is similar to that of the first-embodiment components with respect to their tier-stacking dimension.

While providing good heat-removal characteristics, each of the above-described apparatus are preferably configured with features known for typical rackmount enclosures, providing shock, vibration and/or dust protection. For example, the external openings (e.g., the vents) are preferably adequately shielded from the components, providing good shielding against electromagnetic radiation.

It is to be understood that the invention comprises apparatus and related methods for designing and for producing cooling enclosures, as well as the apparatus and cooling methods of the enclosures themselves. Additionally, various embodiments of the invention can incorporate various combinations of the above described embodiment features. In short, the above disclosed features can be combined in a wide variety of configurations within the anticipated scope of the invention.

While particular forms of the invention have been illustrated and described, it will be apparent that various modifications can be made without departing from the spirit and scope of the invention. For example, while typical electronic computer components have been described, the cooling of other components such as electrical or optical devices in signal processing systems, and the like, are within the scope of the invention. Thus, although the invention has been described in detail with reference only to the preferred embodiments, those having ordinary skill in the art will appreciate that various modifications can be made without departing from the scope of the invention. Accordingly, the invention is not intended to be limited by the above discussion, and is defined with reference to the following claims.

What is claimed is:

1. A modular processing system for mounting in a multi-tiered support, comprising:
   a chassis configured for mounting in the multi-tiered support;
   a plurality of components within the chassis; and
   a cooling system including a reconfigurable plenum and a blower, the blower being configured to pressurize the plenum;
   wherein the plenum defines a plurality of orifices in the chassis, each orifice of the plurality of orifices being configured to direct pressurized air from the plenum to flow toward a respective component of the plurality of components; and
   wherein the plenum comprises:
      a tube defining a first orifice of the plurality of orifices, the tube being cantilevered and bendable enough to be adjustable such that the first orifice can be reconfigured to direct pressurized air toward components at different locations within the chassis.

2. The modular processing system of claim 1, and further comprising:
   a controller configured to actively control the heat dissipation from the plurality of components provided by the cooling system during operation of the cooling system so as to control the relative flow rate of at least one component relative to the other components.

3. The modular processing system of claim 2, wherein the controller is configured to control the operation of the cooling system based on the cooling needs of the components toward which the orifices direct air.

4. The modular processing system of claim 2, wherein the controller is configured to control the air pressure within the plenum.

5. The modular processing system of claim 2, wherein the controller is configured to control the power level at which the blower operates.

6. The modular processing system of claim 2, and further comprising a second blower, wherein the controller is configured to selectively control the power levels at which the blowers operate.

7. The modular processing system of claim 2, wherein:
   the plenum includes an adjustable valve configured to controllably limit airflow from a first orifice of the plurality of orifices; and
   the controller is configured to control the valve.

8. The modular processing system of claim 7, wherein the adjustable valve can be closed to substantially prevent airflow from the first orifice.

9. The modular processing system of claim 2, wherein:
   the plenum includes a system of adjustable valves configured to separately and adjustably control the airflow from a first orifice and a second orifice of the plurality of orifices; and
   the controller is configured to control the system of adjustable valves.

10. The modular processing system of claim 9, wherein the controller is further configured to control air pressure within the plenum.

11. A modular processing system for mounting in a multi tiered support, comprising:
    a chassis configured for mounting in the multi tiered support;
    a plurality of components within the chassis; and
    a reconfigurable means for directing air to flow from a pressurized plenum toward one component of the plurality of components;
    wherein the reconfigurable means for directing is configured with a passageway of an adjustable configuration that allows an open end of the passageway to be positionally changed to adjustably direct air toward different locations within the chassis.

12. A modular processing system for mounting in a multi tiered support, comprising:
    a chassis configured for mounting in the multi tiered support;
    a plurality of electronic assemblies on a front side of the chassis;
    a blower not on the front side of the chassis; and
    an intake manifold having a front panel at the front side of the chassis;
    wherein the intake manifold forms a chamber, the intake manifold front panel defines intake air vents in fluid communication with the chamber, and the intake manifold defines a blower port in fluid communication with the chamber such that the intake manifold is configured to place the exterior of the chassis in fluid communication with the blower; and
    wherein the intake manifold front panel extends across one or more of the plurality of electronic assemblies.

13. The modular processing system of claim 12, wherein the intake manifold front panel extends across the chassis front side.

14. The modular processing system of claim 12, and further comprising a second blower, wherein the intake manifold further defines a second blower port in fluid communication with the chamber such that the intake manifold is configured to place the exterior of the chassis in fluid communication with the second blower.

15. The modular processing system of claim 12, and further comprising a distribution plenum configured to receive air from the blower and to distribute the received air to components within the chassis.

16. The modular processing system of claim 12, wherein the chassis is a 1U chassis.

* * * * *